United States Patent
Inoue et al.

(10) Patent No.: US 8,401,358 B2
(45) Date of Patent: Mar. 19, 2013

(54) ATTACHMENT PART AND ELECTRONIC APPARATUS

(75) Inventors: Takashi Inoue, Kawasaki (JP); Kazuo Fujita, Kawasaki (JP); Seiichiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 314 days.

(21) Appl. No.: 12/616,830

(22) Filed: Nov. 12, 2009

(65) Prior Publication Data

US 2010/0129041 A1    May 27, 2010

(30) Foreign Application Priority Data

Nov. 25, 2008 (JP) ................ 2008-300194

(51) Int. Cl.
*G02B 6/00* (2006.01)
(52) U.S. Cl. ............. 385/137; 385/134; 385/139
(58) Field of Classification Search ......... 385/134–139
See application file for complete search history.

(56) References Cited

U.S. PATENT DOCUMENTS

| | | | | |
|---|---|---|---|---|
| 6,086,265 A * | 7/2000 | Kuribayashi et al. | ............ | 385/92 |
| 6,744,961 B2 * | 6/2004 | Horishita | ............... | 385/134 |
| 7,270,485 B1 * | 9/2007 | Robinson et al. | ............ | 385/55 |
| 7,636,507 B2 * | 12/2009 | Lu et al. | ............ | 385/135 |
| 2003/0210866 A1 * | 11/2003 | Kuhara et al. | ............ | 385/49 |
| 2010/0028017 A1 * | 2/2010 | Mizoguchi | ............ | 398/141 |

FOREIGN PATENT DOCUMENTS

| | | |
|---|---|---|
| JP | 52-8151 U | 1/1977 |
| JP | 61-55356 U | 4/1986 |
| JP | 63-87782 U | 6/1988 |
| JP | 63-127189 U | 8/1988 |
| JP | 3-46281 A | 2/1991 |
| JP | 4-34751 U | 3/1992 |
| JP | H07-15032 A | 1/1995 |
| JP | 3043671 U | 9/1997 |
| JP | H10-98203 A | 4/1998 |
| JP | 3116738 U | 11/2005 |
| WO | WO 2010052677 A1 * | 5/2010 |

OTHER PUBLICATIONS

Japanese Office Action mailed Jun. 26, 2012 for corresponding Japanese Application No. 2008-300194, with English-language Translation.

Japanese Office Action mailed Jan. 8, 2013 for corresponding Japanese Application No. 2008-300194, with English-language translation.

* cited by examiner

*Primary Examiner* — Ellen Kim
(74) *Attorney, Agent, or Firm* — Fujitsu Patent Center

(57) ABSTRACT

An attachment part includes: a base portion that has a through hole through which a lead of an optical component passes; and a plurality of holding portions that are provided in the base portion, that face each other, and that hold a chassis of the optical component.

20 Claims, 17 Drawing Sheets

FIG. 16A
FIG. 16B
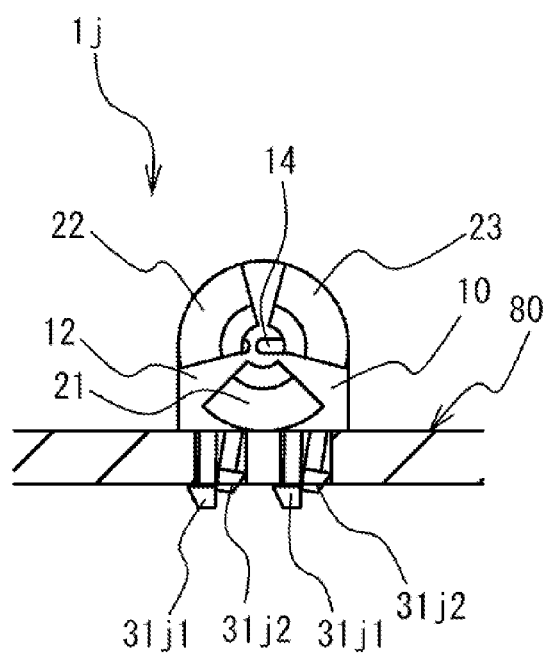
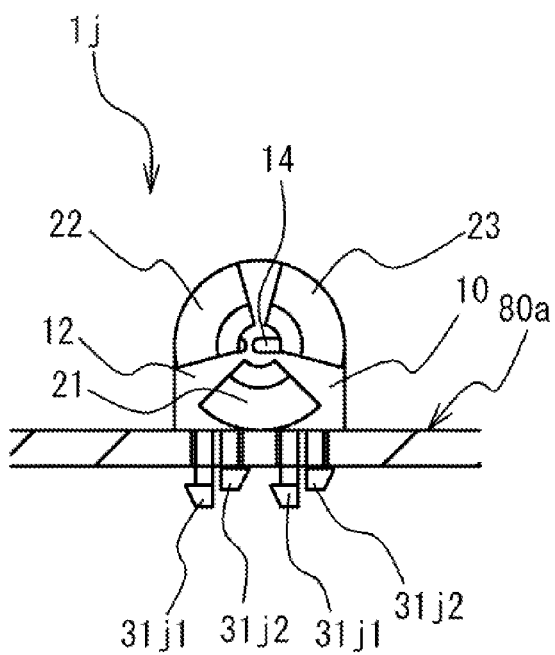

ATTACHMENT PART AND ELECTRONIC APPARATUS

CROSS-REFERENCE TO RELATED APPLICATION

This application is based upon and claims the benefit of priority of the prior Japanese Patent Application No. 2008-300194, filed on Nov. 25, 2008, the entire contents of which are incorporated herein by reference.

FIELD

The embodiments discussed herein are related to attachment parts and electronic apparatuses.

BACKGROUND

There is known an optical component. Such an optical component is attached on a printed substrate. The optical component is attached on the printed substrate by a dedicate attachment part. The related arts are disclosed in Japanese Laid-open Patent Publication Nos. 10-98203 and 7-15032.

There is an attachment part which fastens the optical component with a band. However, the fastening with the band has to be conducted by hand, and may degrade the attachment workability.

SUMMARY

According to an aspect of the embodiment, an attachment part includes: a base portion that has a through hole through which a lead of an optical component passes; and a plurality of holding portions that are provided in the base portion, that face each other, and that hold a chassis of the optical component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 16A and 16B are explanatory views of an attachment part according to a tenth embodiment.

DESCRIPTION OF EMBODIMENTS

A description will be given of embodiments with reference to the accompanying drawings.

[First Embodiment]

Figure 1A:
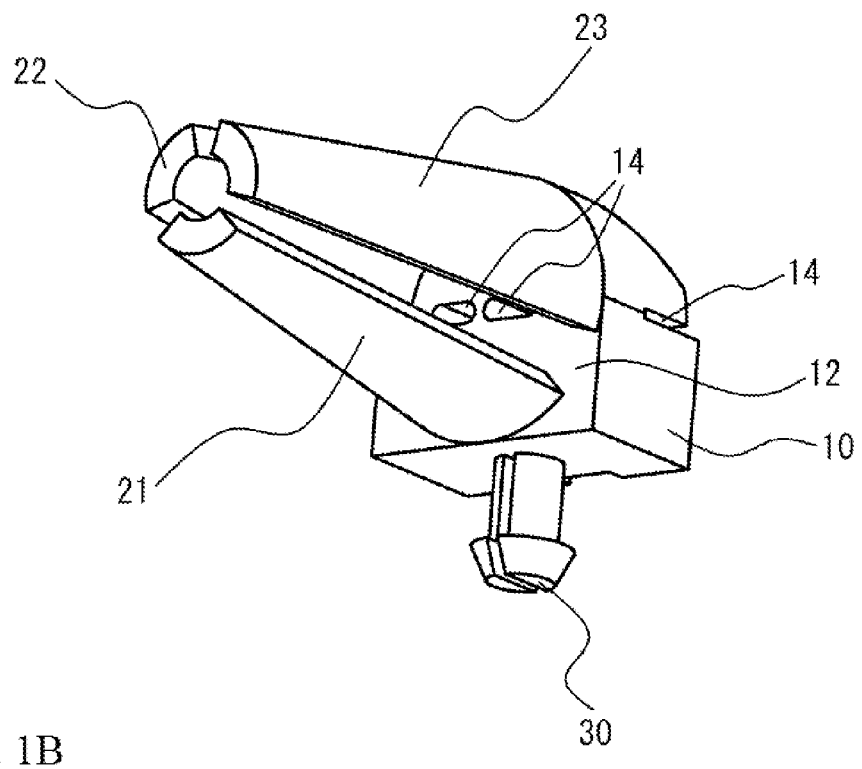
FIGS. 1A and 1B are perspective views of an attachment part according to a first embodiment.
Figure 1B:
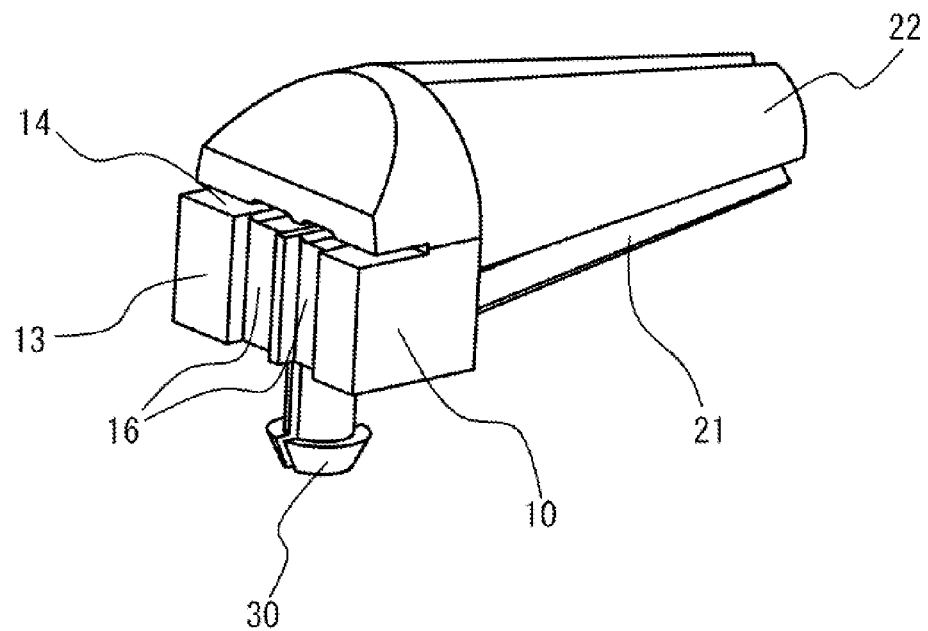

FIGS. 1A and 1B are perspective views of an attachment part 1 according to a first embodiment.

The attachment part 1 includes: a base portion 10, holding pieces 21 to 23 provided in the base portion 10; and a projection portion 30 provided in the base portion 10. The attachment part 1 is integrally made of a synthetic resin. The holding pieces 21 to 23 extend from a front surface 12 of the base portion 10 in the substantially identical direction. The holding pieces 21 to 23 face each other. The projection portion 30 extends downwardly from a bottom surface of the base portion 10. The holding pieces 21 to 23 serve as holding portions. The holding pieces 21 to 23 sandwich the optical component to apply even pressures on its chassis. The projection portion 30 serves to attach the attachment part 1 to a printed substrate. The base portion 10 has a through hole 14 through which a lead of the optical component, to be mentioned later, is capable of passing. The through hole 14 has a slit shape horizontally spreading from the front surface 12 to a rear surface 13.

The holding pieces 21 to 23 are spaced apart from each other with a given clearance, and entirely shape a substantially circular cone. The holding pieces 21 to 23 are elastically deformable to move their ends toward and away from each other. FIGS. 1A and 1B illustrate a natural state of the holding pieces 21 to 23.

Figure 2:
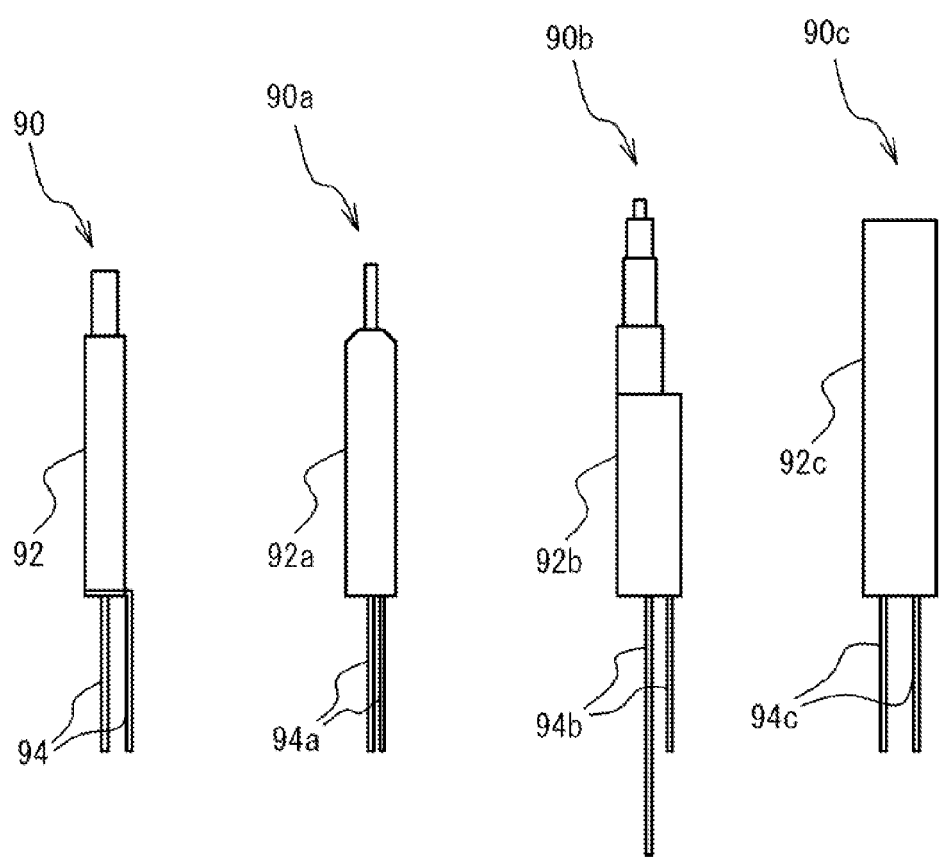
FIG. 2 is an explanatory view of an optical component.

Herein, the optical component will be described. FIG. 2 is an explanatory view of the optical component. As illustrated in FIG. 2, there are optical components 90 to 90c having different shapes. Two leads 94 to 94c extend from lower ends of chassis 92 to 92c, respectively. The leads 94 to 94c ensure the electrical connection between the printed substrate, to be mentioned later, and the optical components 90 to 90c, respectively. In the optical components 90 to 90c, the distances of the leads 94 to 94c are different from each other. The chassis 92 to 92c each has a substantially cylindrical shape. An optical fiber, not illustrated, is attached on each of upper ends of the chassis 92 to 92c.

Figure 3A:
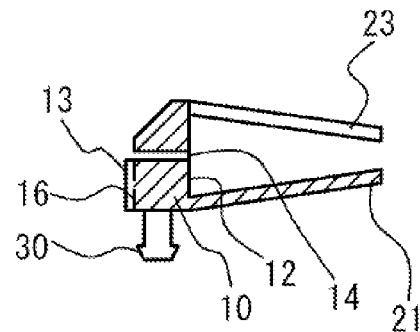
FIGS. 3A to 3D are explanatory views of an attachment of the optical component on a printed substrate.
Figure 3B:
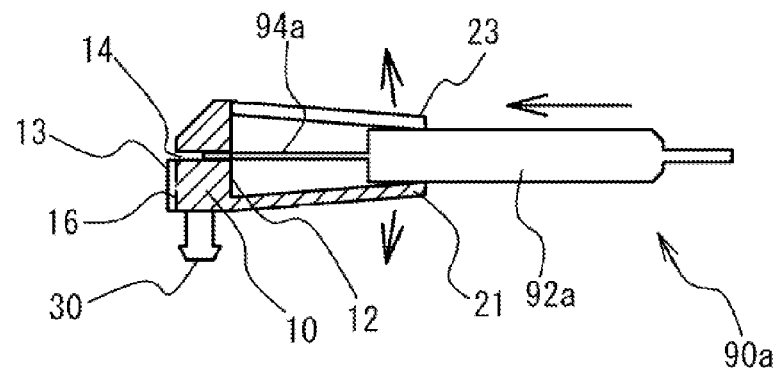

Next, a description will be given of the attachment of the optical component on the printed substrate. FIGS. 3A to 3D, 4A, and 4B are explanatory views of the attachment of the optical component on the printed substrate. The attachment of an optical component 90a will be described. FIG. 3A illustrates a cross section of the attachment part 1. The through hole 14 passes through the base portion 10 from the front surface 12 to the rear surface 13. The holding pieces 21 to 23 are closer to each other from the base portion 10 side toward their ends, when they do not sandwich the optical component. As illustrated in FIG. 3B, the optical component 90a is inserted into the holding pieces 21 to 23 against their elastic restoring forces. When the optical component 90a is inserted into the holding pieces 21 to 23, the holding pieces 21 to 23 are deformed to move their ends away from each other. The leads 94 are inserted into the through hole 14.

Figure 3C:
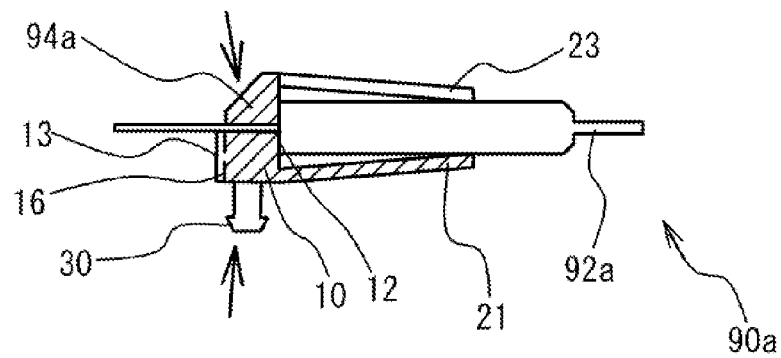

As illustrated in FIG. 3C, when the optical component 90a is inserted to reach the base portion 10 side, a lower surface of the optical component 90a comes into contact with the front surface 12. In this state, the optical component 90a is held by the elastic restoring forces of the holding pieces 21 to 23. In this manner, the optical component 90a is attachable to the attachment part 1 with ease. Specifically, the holding pieces 21 to 23 sandwich an outer periphery of an axis of an chassis 92a of the optical component 90a. Therefore, the attachment part 1 prevents the optical component 90a from rattling in the direction perpendicular to its axial direction.

In this state, when the base portion 10 is pushed upwardly and downwardly, the through hole 14 is crushed to be compressively deformed such that leads 94a are sandwiched thereby. While the leads 94a are sandwiched by the through hole 14, the optical component 90a is prevented from being displaced in its axial direction with respect to the attachment part 1. Additionally, the reason why the through hole 14 is shaped to have a slit shape is to facilitate deforming the through hole 14 to be crushed.

Figure 3D:
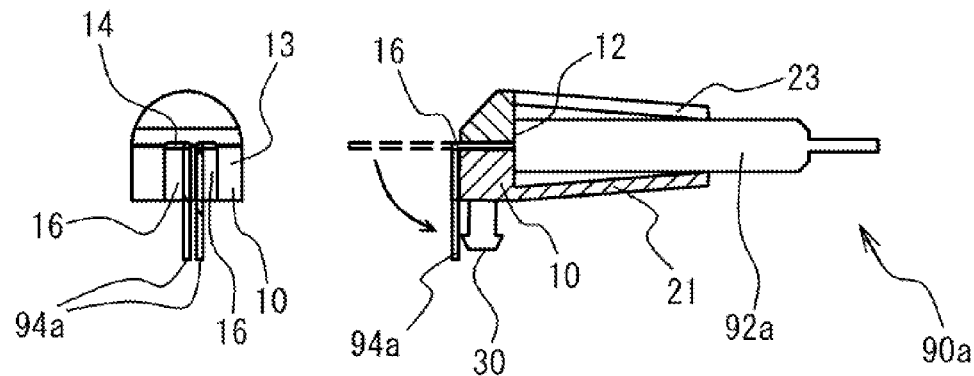

Next, as illustrated in FIG. 3D, the leads 94a extending from the through hole 14 are bent downwardly along the rear surface 13. At the time of bending, the leads 94a are bent along the rear surface 13 at a corner portion, where the rear surface 13 and the inner surface of the through hole 14 are intersected. The rear surface 13 corresponds to a definition surface for defining an angle of the bending of the lead 94a. This facilitates the workability of bending the leads 94a. Further, the base portion 10 has the corner portion for facilitating bending of the leads 94a passing through the through hole 14. This also improves the workability.

Further, the leads 94a are bent along the rear surface 13 with the chassis 92a being in contact with the front surface 12, thereby preventing the optical component 90a from being displaced in its axial direction with respect to the base portion 10. That is, the chassis 92a abuts the front surface 12, and the bent portion of the lead 94a abuts the corner portion of the base portion 10, thereby defining the position of the optical component 90a with respect to the base portion 10. Accordingly, the optical component 90a is prevented from rattling in its axial direction.

FIG. 3D illustrates the rear surface 13 of the base portion 10 after leads 94a are bent. The rear surface 13 is provided with two groove portions 16 separating two leads 94a from each other. The groove portions 16 extend vertically. The leads 94a are respectively accommodated in the groove portions 16, thereby preventing the leads 94a from contacting and short-circuiting each other. Additionally, an insulated tube does not have to be attached to one of the leads 94a to prevent short circuit. This improves the workability.

Figure 4A:
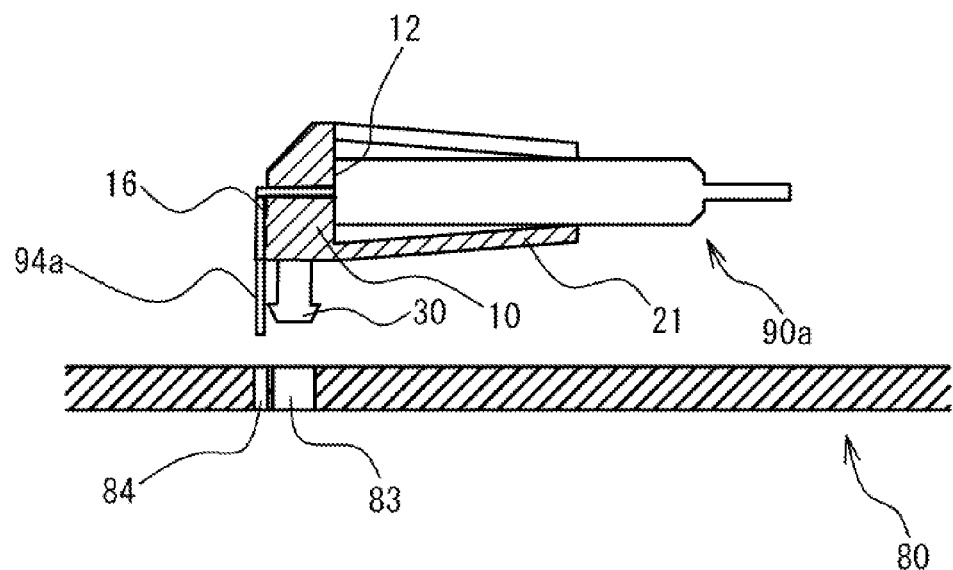
FIGS. 4A and 4B are explanatory views of the attachment of the optical component on the printed substrate.
Figure 4B:
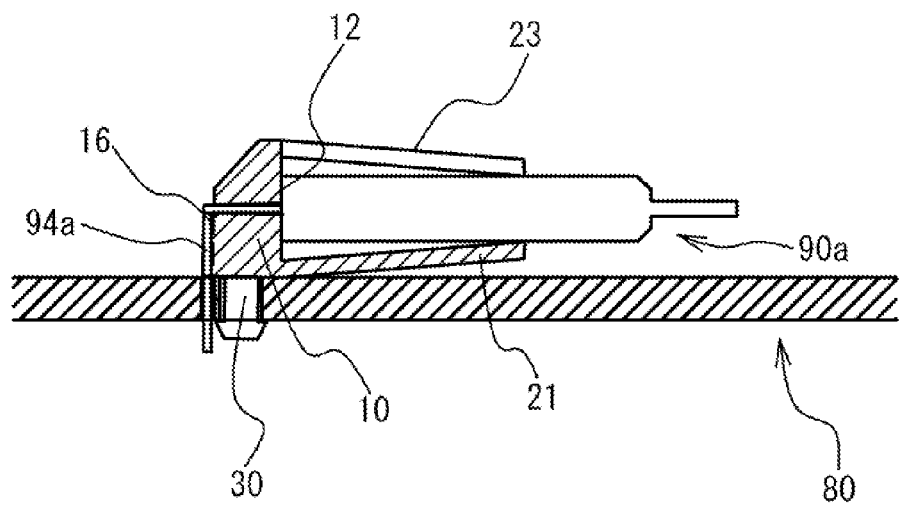

Next, as illustrated in FIGS. 4A and 4B, the attachment part 1 is attached to a printed substrate 80. The projection portion 30 and the leads 94a are inserted into an attachment hole 83 and through holes 84 formed in the printed substrate 80, respectively. The projection portion 30, to be described later in more detail, has an end with a flange shape, thereby engaging the projection portion 30 with the printed substrate 80 after the projection portion 30 is inserted into the attachment hole 83. Thus, the lower surface of the base portion 10 is brought into contact with the upper surface of the printed substrate 80, thereby supporting the attachment part 1. Next, the leads 94a and the printed substrate 80 are soldered. In this way, the optical component 90a is attached on the printed substrate 80.

Consequently, the optical component can be attached to the attachment part 1, and the attachment part 1 attached with the optical component can be also attached to the printed substrate. This improves the workability of the attachment. Further, since the optical component 90a is held by the holding pieces 21 to 23, a fastening fluctuation which may not be caused as seen in a case where an operator manually fastens the optical component to the attachment part by use of the band. This prevents the optical component from being broken caused by a too strong fastening force. This also prevents the optical component from rattling caused by a too weak fastening force.

Figure 5A:
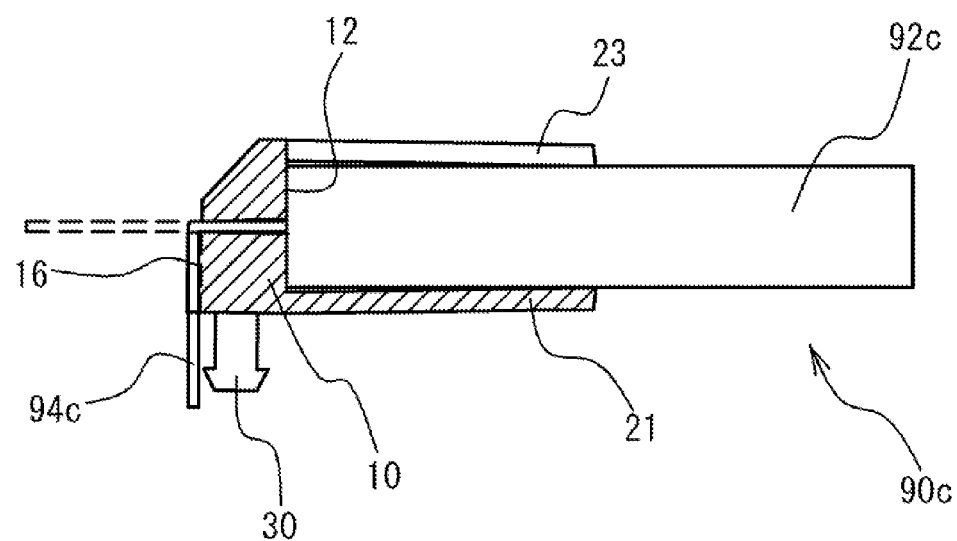
FIGS. 5A and 5B are explanatory views of a state in which the optical component is attached to the attachment part.
Figure 5B:
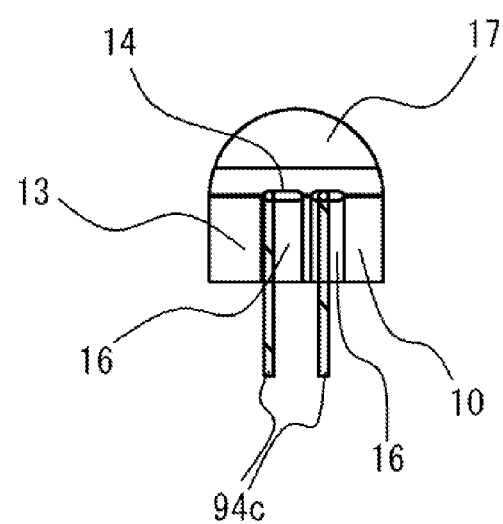

Next, a description will be given of a state in which the optical component 90c is attached to the attachment part 1. FIGS. 5A and 5B are explanatory views of the state in which the optical component 90c is attached to the attachment part 1. The chassis 92c of the optical component 90c has a diameter larger than that of the chassis 92 to 92b. Since the holding pieces 21 to 23 are elastically deformable to move away from each other, the attachment part 1 is capable of holding the optical component 90c as illustrated in FIG. 5A. In this way, the attachment part 1 is capable of attaching the optical component with a different size. Additionally, the distance between the leads 94c of the optical component 90c is larger than that between the leads 94a. In this way, the width of the groove portions 16 is applicable to the optical component having a different distance between the leads, as illustrated in FIG. 5B. This enables the plural leads with different distances to be separated by the groove portions 16. Thus, the attachment part 1 improves its versatility.

Figure 6:
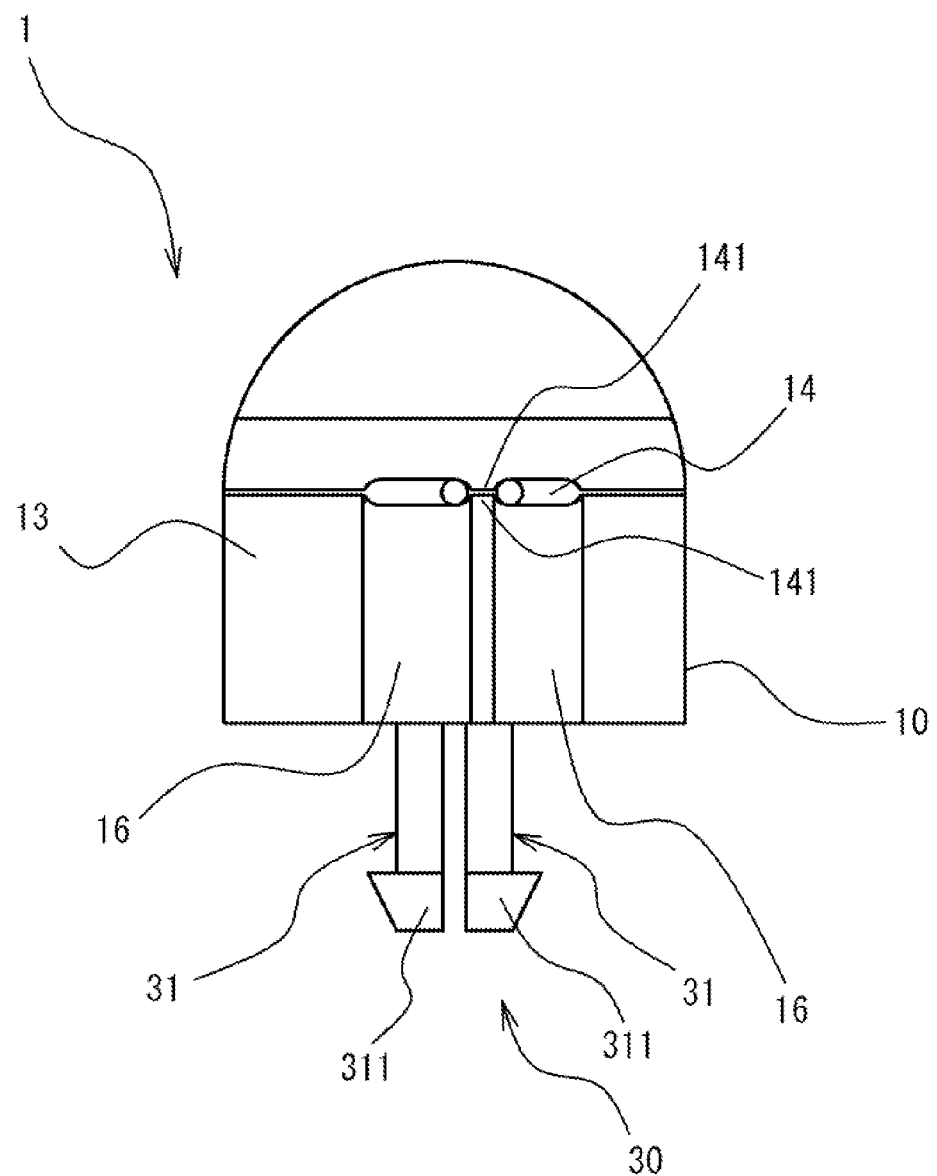
FIG. 6 is an enlarged view of the attachment part when viewed from a rear surface.

Next, a description will be given of the through hole 14 and the projection portion 30. FIG. 6 is an enlarged view of the attachment part 1 when viewed from the rear surface 13. As illustrated in FIG. 6, the through hole 14 has an oblong hole shape extending horizontally. With this arrangement, the attachment part 1 can be adapted to the plural optical components with the different distances between two leads. In this way, the attachment part 1 has the versatility. Further, the through hole 14 is provided with bump portions 141 facing each other to separate two leads.

That is, by the bump portions 141, the width of the through hole 14 is partially narrow so as to separate two leads. This arrangement also prevents the shorting of the leads.

The projection portion 30 will be described. The projection portion 30 includes two projective pieces 31 elastically deformable to move into and out of contact with each other. The projective pieces 31 extend downwardly in substantially parallel with each other. A flange portion 311 is provided at an end portion of the projective piece 31. When the projection portion 30 is inserted into the attachment hole 83 of the printed substrate 80, the flange portions 311 abut an edge of the attachment hole 83 to be elastically deformed to thereby move toward each other. When the flange portions 311 pass through the attachment hole 83, the flange portions 311 are returned to the original states by their elastic restoring forces. Therefore, the flange portions 311 engage the attachment hole 83. Accordingly, the attachment part 1 is attachable to the printed substrate 80 with ease, thereby improving the workability.

[Second Embodiment]

Next, a description will be given of an attachment part 1a according to the second embodiment. Additionally, the same components as the first embodiment have the same reference numerals in order to avoid a duplicated explanation. FIGS.

7A to 7C are explanatory views of the attachment part 1a according to the second embodiment.

Figure 7A:
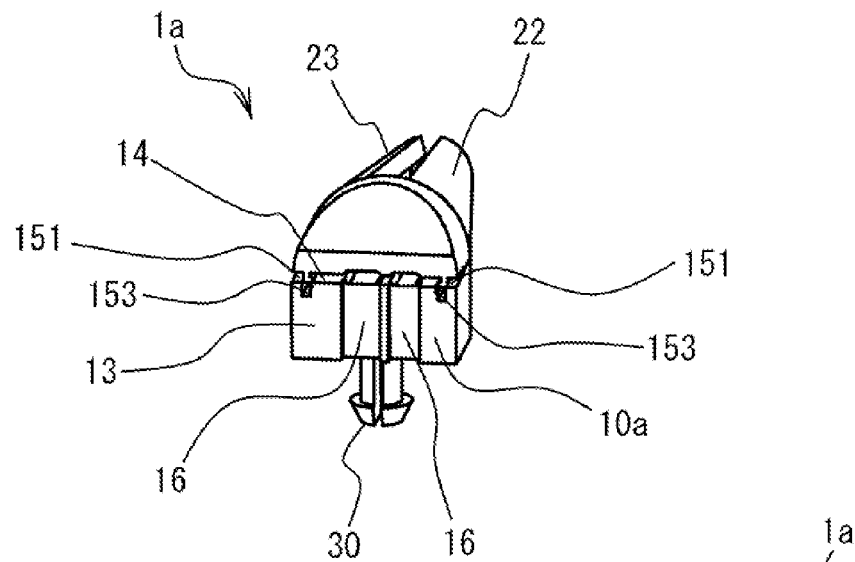
FIGS. 7A to 7C are explanatory views of an attachment part according to a second embodiment.
Figure 7B:
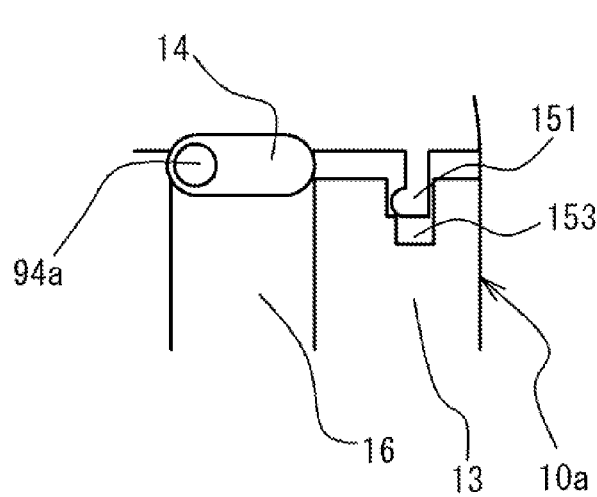
Figure 7C:
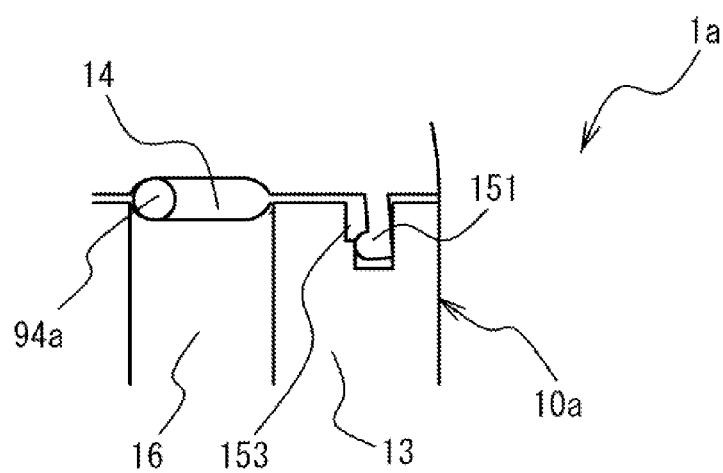

As illustrated in FIG. 7A, protruding pieces 151 and recess portions 153 are arranged in the vicinity of the through hole 14. The protruding piece 151 projects from an upper surface of the through hole 14 to its lower surface. The recess portion 153 is arranged at the lower surface of the through hole 14 and at a position that corresponds to the protruding piece 151. FIG. 7B is an enlarged view of the vicinity of the protruding piece 151 and the recess portion 153. Additionally, FIG. 7B illustrates the state where the leads 94a penetrating through the through hole 14 is not yet sandwiched by the through hole 14. The protruding piece 151 has an end with a flange portion. Further, the recess portion 153 has a step shape, and its width decreases as its depth increases. When a base portion 10a is pushed upwardly and downwardly, the through hole 14 is crushed, so that the end of the protruding piece 151 fits a narrow width portion of the recess portion 153 as illustrated in FIG. 7C. The fitting of the protruding piece 151 and the recess portion 153 is maintained by frictional resistances of the end of the protruding piece 151 and the narrow width portion of the recess portion 153. This maintains the state where the base portion 10a is pushed. That is, the protruding piece 151 and the recess portion 153 correspond to a base lock portion. Thus, the state where the through hole 14 is crushed is maintained, whereby the state where the leads 94a are sandwiched by the through hole 14 is maintained. Accordingly, the operator does not have to constantly push the base portion 10a, thereby improving the workability.

[Third Embodiment]

Figure 8A:
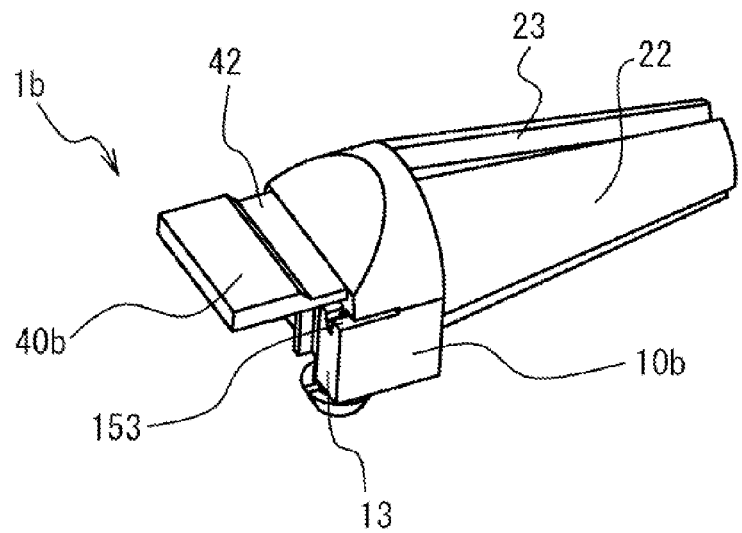
FIGS. 8A to 8C are explanatory views of an attachment part according to a third embodiment.
Figure 8B:
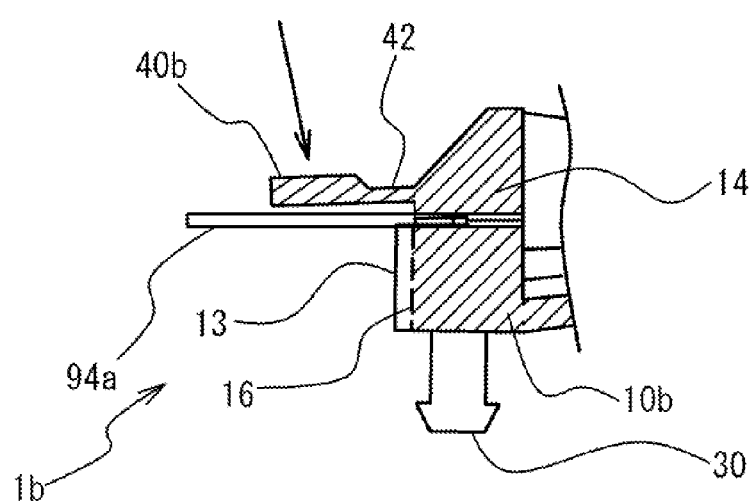
Figure 8C:
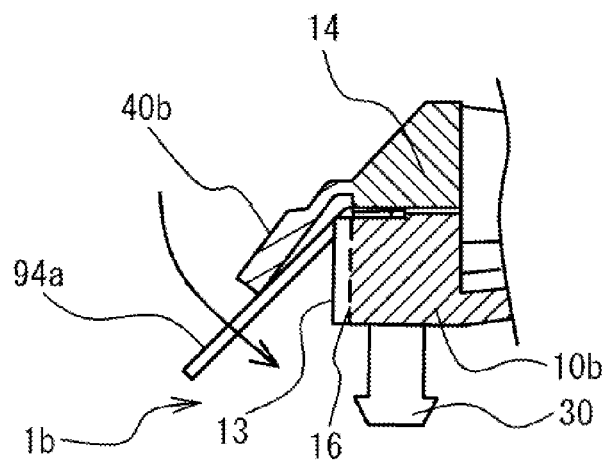

Next, a description will be given of an attachment part 1b according to the third embodiment. FIGS. 8A to 8C are explanatory views of the attachment part 1b according to the third embodiment.

As illustrated in FIG. 8A, a lever portion 40b is provided at the rear surface 13 of a base portion 10b. The lever portion 40b is provided at an upper side of the through hole 14. The lever portion 40b has a thin plate shape. The lever portion 40b has a thin portion 42 provided near the base portion 10b. The thin portion 42 permits the lever portion 40b to be readily bent. The lever portion 40b has a function for aiding to bend the leads 94a.

As illustrated in FIG. 8B, when the lever portion 40b is bent from the horizontal state to the vertical state along the rear surface 13, the lever portion 40b simultaneously pushes and bents two leads 94a. This facilitates the work of bending the leads 94a, and also improves the workability.

In addition, when the lever portion 40b is bent from the horizontal state to the vertical state, the force is exerted to compress the base portion 10b upwardly and downwardly, thereby crushing the through hole 14. Therefore, the leads 94a are sandwiched by the through hole 14, thereby preventing the optical component 90a from being displaced with respect to the base portion 10b. That is, by the work of bending the lever portion 40b, the prevention of the displacement mentioned above and the work of bending the leads 94a are accomplished as a series of operations. Consequently, the workability is improved.

[Fourth Embodiment]

Figure 9A:
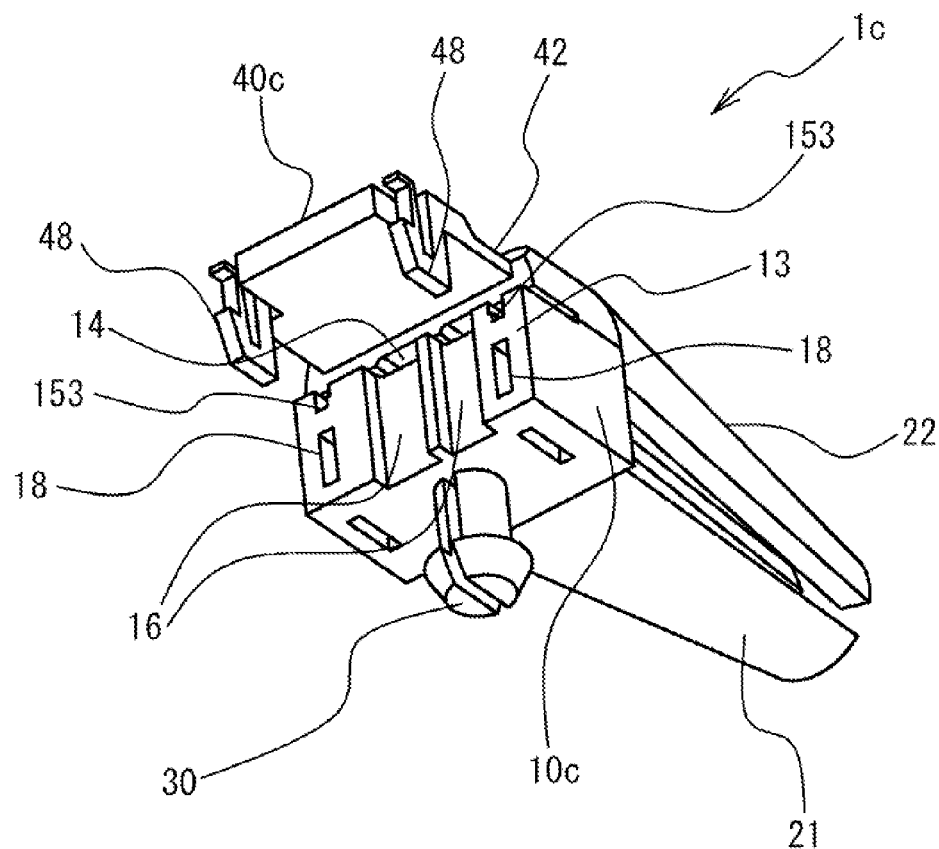
FIGS. 9A and 9B are explanatory views of an attachment part according to a fourth embodiment.
Figure 9B:
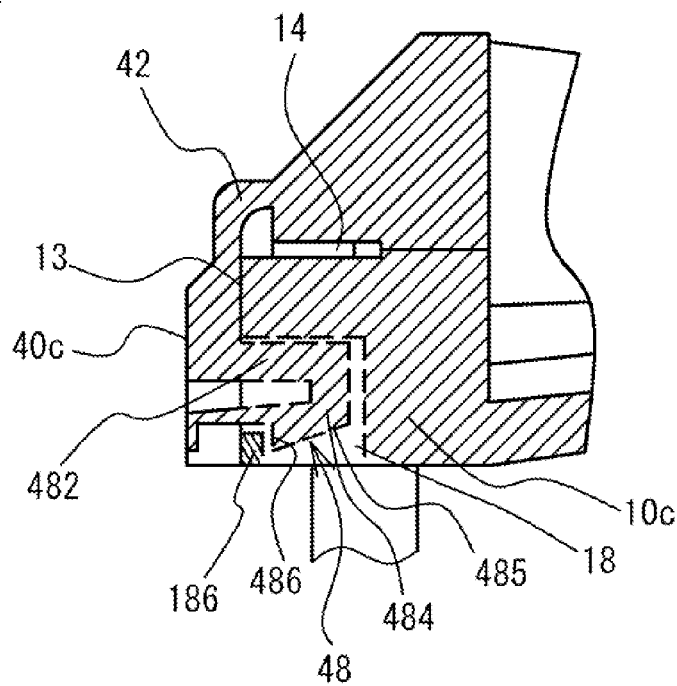

Next, a description will be given of an attachment part 1c according to the fourth embodiment. FIGS. 9A and 9B are explanatory views of the attachment part 1c according to the fourth embodiment. As illustrated in FIG. 9A, arm portions 48 are formed at opposite end portions of a lever portion 40c, respectively. Further, insert holes 18 are formed to positionally correspond to the arm portions 48. The arm portion 48 has a substantially U shape when viewed from its side. The arm portion 48 and the insert hole 18 are engageable with each other.

FIG. 9B illustrates a cross section of a state where the arm portion 48 engages the insert hole 18. The arm portion 48 has: a first extending portion 482 extending in a direction substantially perpendicular to the main surface of the lever portion 40c; and a second extending portion 484 curving in a direction substantially opposite to the extending direction of the first extending portion 482. The first and second extending portions 482 and 484 are elastic deformable to be close to each other. The insert hole 18 has a stopper 186 corresponding to a corner of a base portion 10c. The arm portion 48 has a sliding surface 485 slidably contacting the stopper 186 when the lever portion 40c is bent to insert the arm portion 48 into the insert hole 18. The sliding surface 485 is designed to have a given inclined angle, in order to facilitate the insertion of the arm portion 48 into the insert hole 18. The arm portion 48 has a step portion 486, which engages the stopper 186 when the arm portion 48 is deeply inserted into the insert hole 18. By engaging the stopper 186 with the step portion 486, the state where the arm portion 48 is inserted into the insert hole 18 is maintained. The state where the lever portion 40c is bent along the rear surface 13 is locked. In other words, the arm portion 48 and the insert hole 18 correspond to a lever lock portion.

Additionally, when the lever portion 40c is bent as mentioned above, the leads 94a are covered with the lever portion 40c and the base portion 10c. This prevents the leads 94a from being corroded. Further, this prevents another part from contacting the leads 94a. Therefore, even when the whisker is generated in its lead or another lead, the leads can be prevented from short-circuiting each other.

[Fifth Embodiment]

Figure 10A:
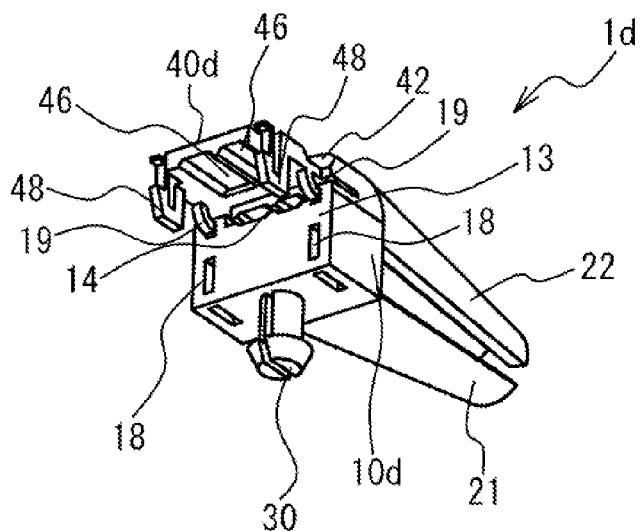
FIGS. 10A to 10C are explanatory views of an attachment part according to a fifth embodiment.
Figure 10B:
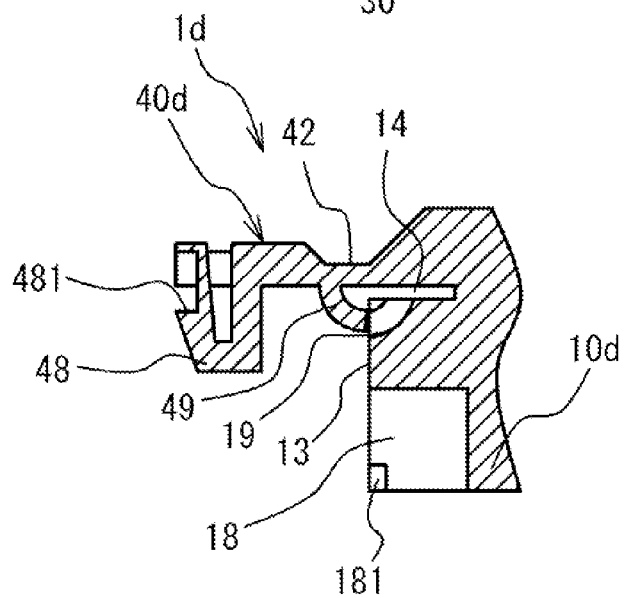
Figure 10C:
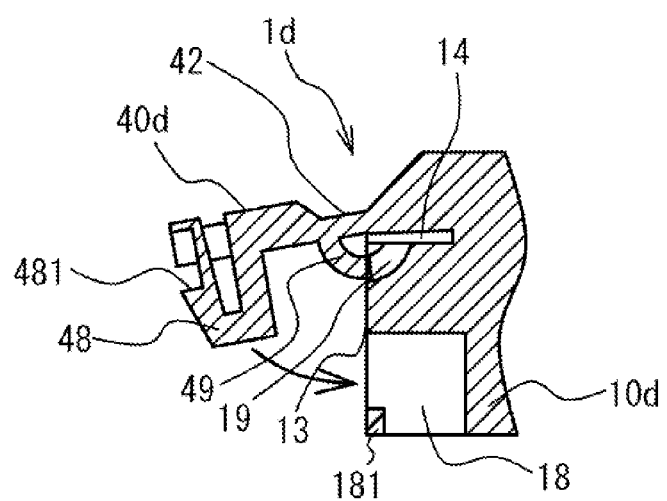

Next, a description will be given of an attachment part 1d according the fifth embodiment. FIGS. 10A to 10C are explanatory views of the attachment part 1d according to the fifth embodiment.

As illustrated in FIG. 10A, a lever portion 40d is provided with guide pieces 49. The guide pieces 49 protrude like an arc from a surface, which can face the rear surface 13, of the lever portion 40d. Further, the insert holes 19 are provided in the rear surface 13, and each has an arc shape when viewed from their sides. Furthermore, two groove portions 46 are provided in the lever portion 40d at its surface capable of facing the rear surface 13.

FIGS. 10B and 10C are cross-sectional view for illustrating a guide piece 49 and the insert hole 19. The guide piece 49 has the substantially arc shape centering on a pivot point of bending the lever portion 40d. The shape of the insert hole 19 is complementary to that of the guide piece 49. When the lever portion 40d is bent along the rear surface 13, the guide piece 49 is inserted into the insert hole 19, as illustrated in FIG. 10C. The insert hole 19 and the guide piece 49 are formed in such complementary shapes, whereby the movement of bending the lever portion 40d is guided by engaging the insert hole 19 and the guide piece 49 until the lever portion 40d is bent along the rear surface 13.

Additionally, when the lever portion 40d is bent, the force is exerted to a base portion 10d to crush the through hole 14. Therefore, the guide piece 49 slightly moves downwardly with respect to the rear surface 13. The locations of the guide piece 49 and the insert hole 19 are designed in light of the movement of the guide piece 49 relative to the rear surface 13. Accordingly, the guide piece 49 is smoothly inserted into the insert hole 19, thereby improving the workability.

Moreover, the plural leads are separated by the 46 with the lever portion 40d bent along the rear surface 13. This prevents the short-circuiting the leads.

[Sixth Embodiment]

Figure 11A:
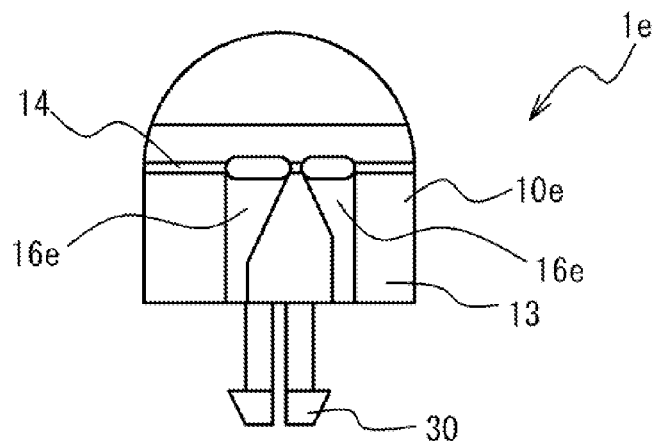
FIGS. 11A to 11C are explanatory views of an attachment part according to a sixth embodiment.
Figure 11B:
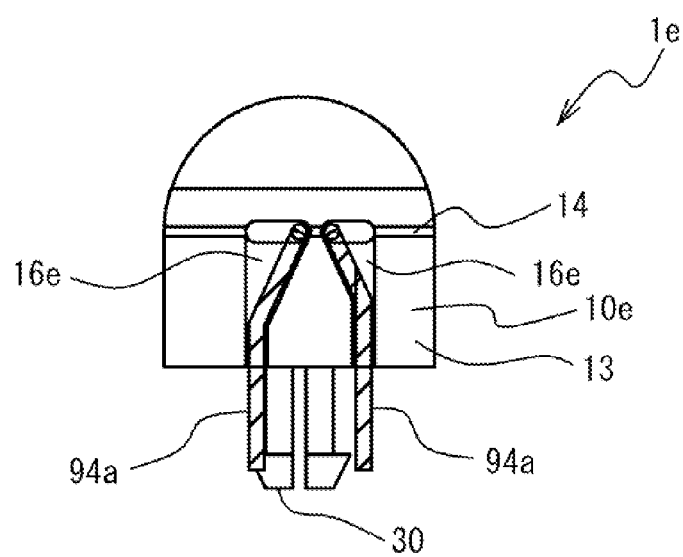
Figure 11C:
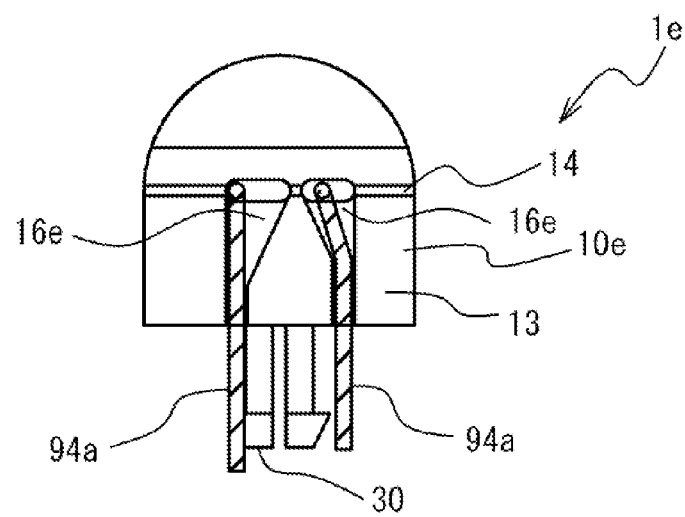

A next, a description will be given of an attachment part 1e according to the sixth embodiment. FIGS. 11A to 11C are explanatory views of the attachment part 1e according to the sixth embodiment.

As illustrated in FIG. 11A, each of groove portions 16e is made narrower from the upper side to the down side. FIG. 11B illustrates the state where the leads 94a, which have a comparatively short distance between themselves, are accommodated in the groove portions 16e, respectively. Since the distance between the leads 94a is short, the leads 94a are guided by the groove portions 16e to increase the distance from the secured end side to the free end side.

FIG. 11C illustrates the state where the leads 94c, which have a comparatively long distance, are accommodated in the groove portions 16e. Since the distance between the leads 94c are comparatively long, one of the leads 94c is linearly guided by the groove portions 16e. The other of the leads 94c is guided to increase the distance between the leads 94c.

In any pair of the leads 94a and 94c, the distance near their free ends are brought into constant. That is, the shapes of the groove portions 16e guide the plural leads to make the distance thereof constant from their secured ends side from their fee ends side. Therefore, the various optical components can be attached to the printed substrate without changing the position of the hole, provided in the printed substrate, for the lead. Consequently, the versatility of the attachment part 1e is improved.

[Seventh Embodiment]

Figure 12A:
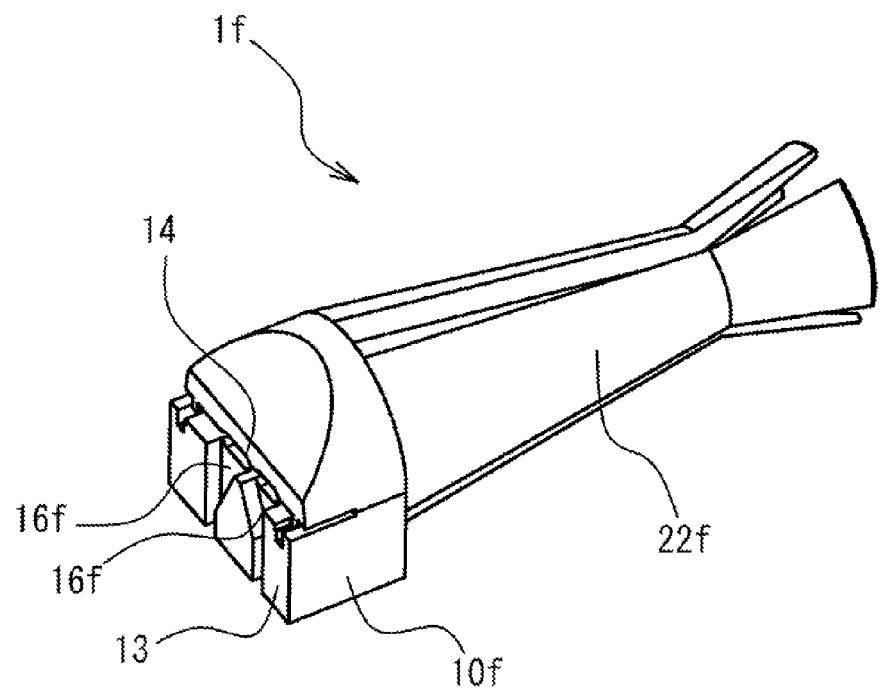
FIGS. 12A and 12B are explanatory views of an attachment part according to a seventh embodiment.
Figure 12B:
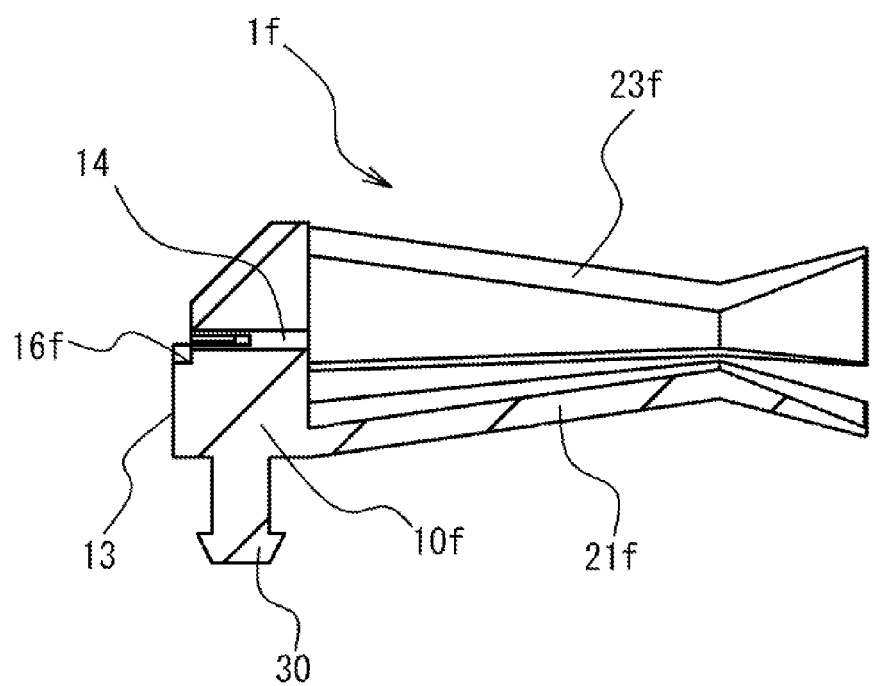

Next, a description will be given of an attachment part 1f according to a seventh embodiment. FIGS. 12A and 12B are explanatory views of the attachment part 1f according to the seventh embodiment.

As illustrated in FIGS. 12A and 12B, holding pieces 21f to 23f are close to each other from a base portion 10f side to a partway between the base portion and ends side. Additionally, the holding pieces 21f to 23f are away from each other from the partway to their ends side. Since the holding pieces 21f to 23f are away from each other from the partway to their ends side, the insertion of the optical component into the holding pieces 21f to 23f is facilitated. This improves the workability.

[Eighth Embodiment]

Figure 13A:
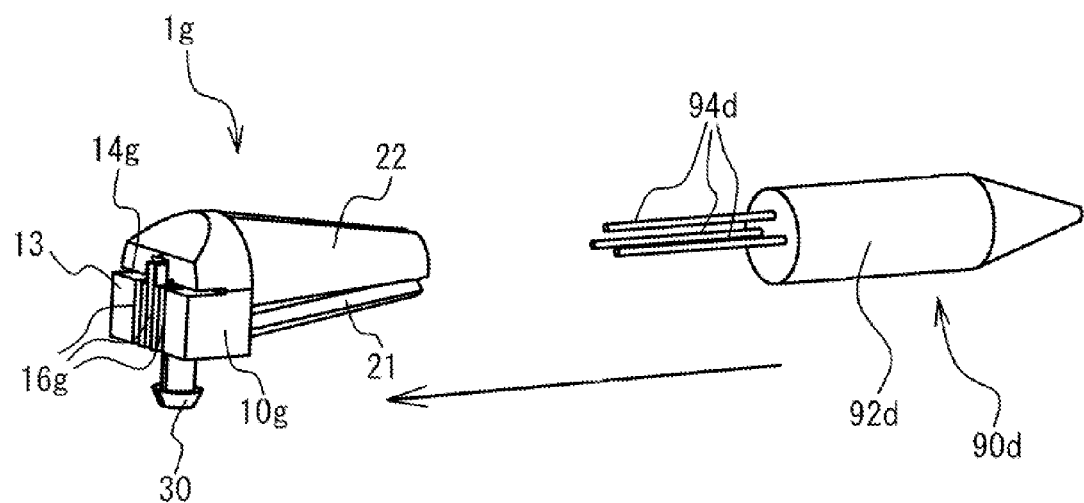
FIGS. 13A and 13B are explanatory views of an attachment part according to a eighth embodiment.
Figure 13B:
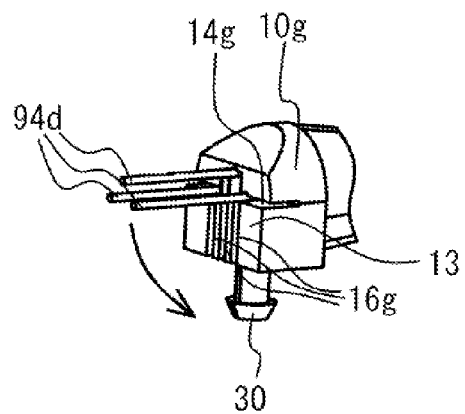

Next, a description will be given of an attachment part 1g according to the eighth embodiment. FIGS. 13A and 13B are explanatory views of the attachment part 1g according to the eighth embodiment.

As illustrated in FIG. 13A, the attachment part 1g is capable of holding an optical component 90d having three leads 94d. Three leads 94d extend from a chassis 92d so as to form a regular triangle shape. A through hole 14g is provided to correspond to each position of the leads 94d. That is, the center portion of the through hole 14g projects upwardly, when viewed from the rear surface 13 side. Therefore, the attachment part 1g is capable of holding the optical component 90d having three leads 94d, as illustrated in FIG. 13B. Further, three groove portions 16g are formed in the rear surface 13. This prevents the leads 94d from shorting. Additionally, the attachment part 1g is also capable of holding the above mentioned optical components 90 to 90c each having two leads. This is because two leads can be inserted into the through hole 14g.

[Ninth Embodiment]

Figure 14A:
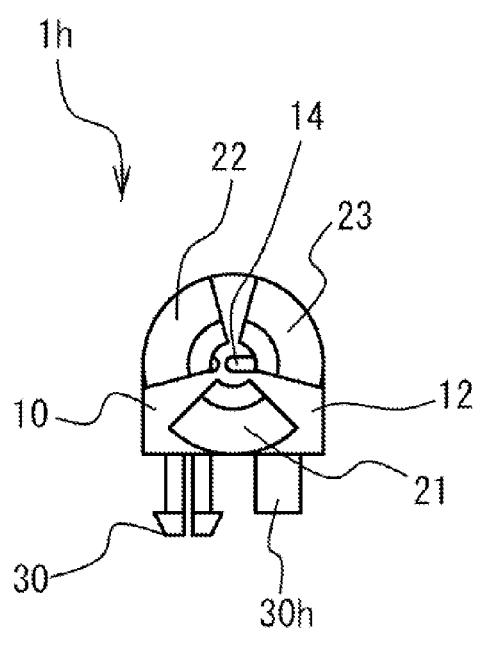
FIGS. 14A and 14B are explanatory views of an attachment part according to a ninth embodiment.
Figure 14B:
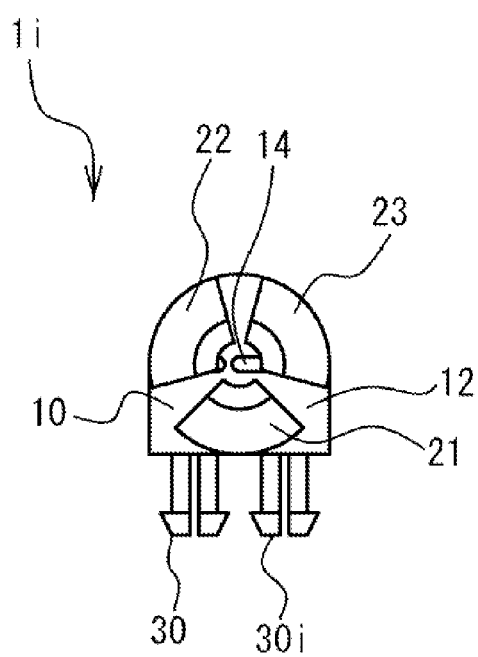

Next, a description will be given of an attachment part 1h according to the ninth embodiment. FIGS. 14A and 14B are explanatory views of the attachment part 1f according to the ninth embodiment and an attachment part 1i according to a variation of the ninth embodiment.

As illustrated in FIG. 14A, the base portion 10 is provided with projection portions 30 and 30h. The projection portions 30 and 30h are substantially parallel to each other. The projection portion 30h has a columnar shape. The printed substrate is provided with holes into which the projection portions 30 and 30h can be fit respectively, and the projection portions 30 and 30h are fitted into the holes, respectively, thereby preventing the rotation of the attachment part 1h with respect to the printed substrate. Further, the base portion 10 is provided with the projection portions 30 and 30i, as illustrated in FIG. 14B. In this case, the attachment part 1i is also prevented from rotating with respect to the printed substrate.

[Tenth Embodiment]

Next, a description will be given of an attachment part 1j according to the tenth embodiment. FIGS. 15A, 15B, 16A and 16B are explanatory views of the attachment part 1j according to the tenth embodiment.

Figure 15A:
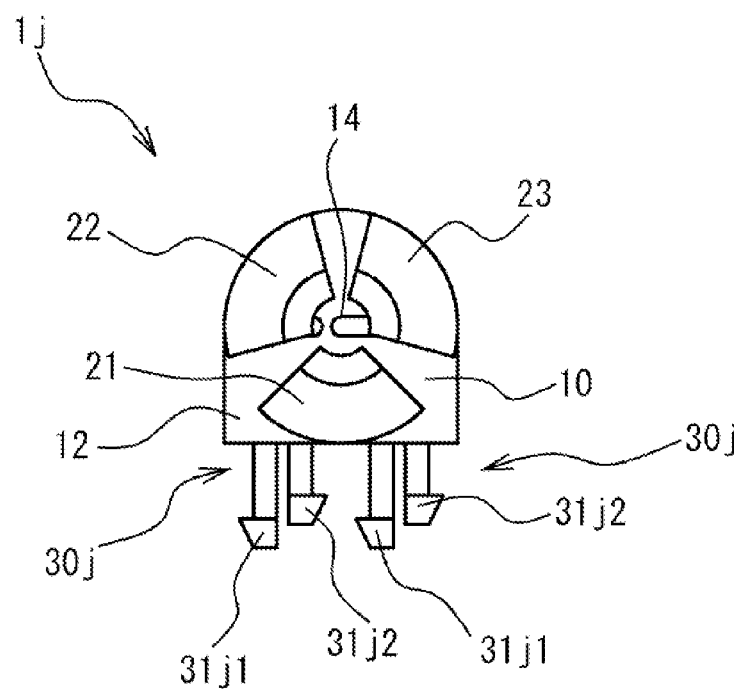
FIGS. 15A and 15B are explanatory views of an attachment part according to a tenth embodiment.
Figure 15B:
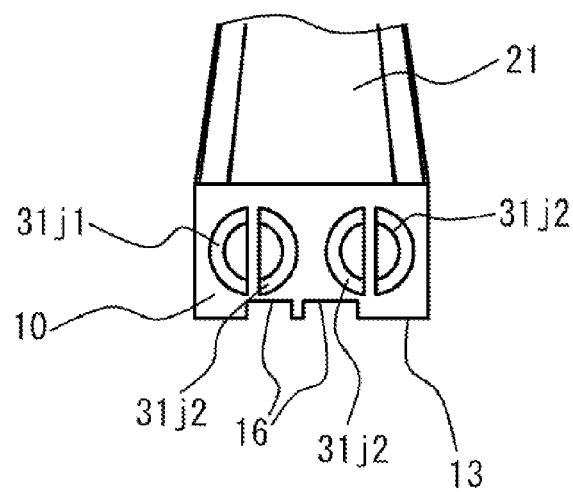

As illustrated in FIG. 15A, each of projection portions 30j includes projective pieces 31j1 and 31j2. The projective piece 31j1 is longer than the projective piece 31j2. FIGS. 16A and 16B illustrate the attachment part 1j attached to the printed substrates 80 and 80a each having a different thickness. The printed substrate 80 is thicker than the printed substrate 80a. The attachment part 1j is secured on the printed substrate 80, which is comparatively thick, by engaging the projective piece 31j1 therewith. In contrast, the attachment part 1j is fixed on the printed substrate 80a, which is comparatively thin, by engaging the projective piece 31j2 therewith. In this manner, the attachment part 1j is attachable to the printed substrate with a different thickness, and improves its versatility.

[Eleventh Embodiment]

Figure 17A:
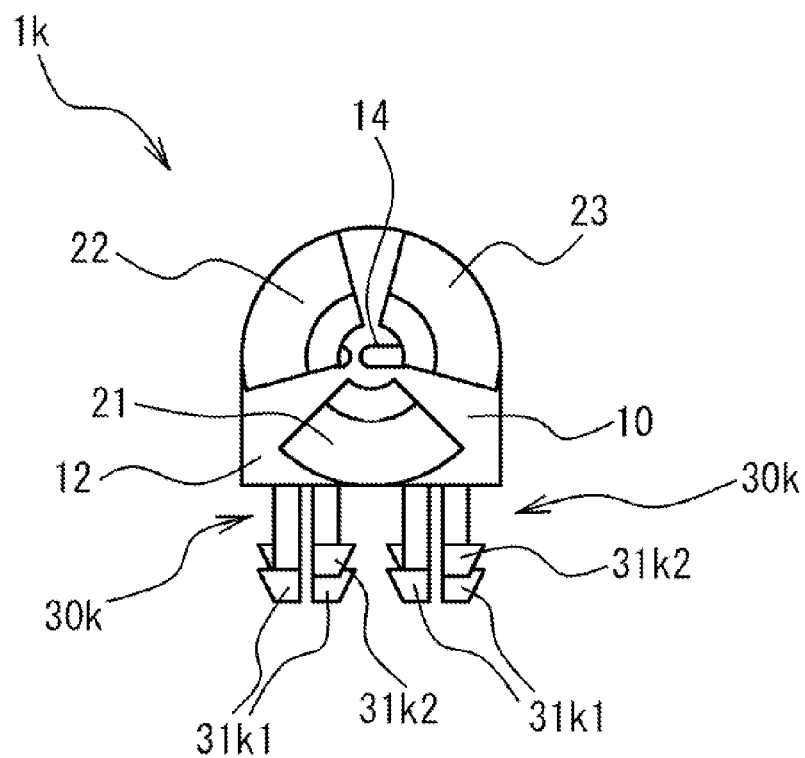
FIGS. 17A and 17B are explanatory views of an attachment part according to an eleventh embodiment.
Figure 17B:
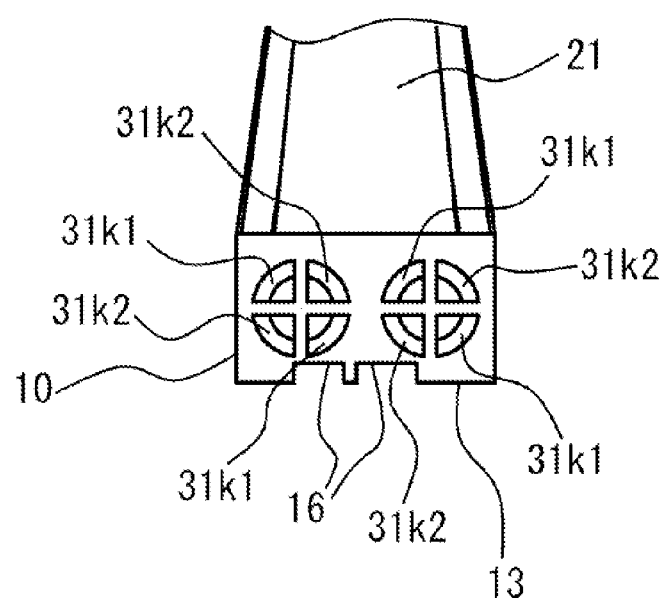

Next, a description will be given of an attachment part 1k according to the eleventh embodiment. FIGS. 17A and 17B are explanatory views of the attachment part 1k according to the eleventh embodiment.

As illustrated in FIGS. 17A and 17B, one of projection portions 30 includes two projective pieces 31k1 and two projective pieces 31k2. The projective piece 31k1 is longer than the projective piece 31k2. As illustrated in FIG. 17B, two projective pieces 31k1 are provided on the diagonal line, and two projective pieces 31k2 are also provided on the other diagonal line. The attachment part 1k is fixed on the printed substrate, which is comparatively thick, by engaging the projective pieces 31k1 therewith, whereas the attachment part 1k is fixed on the printed substrate, which is comparatively thin, by engaging the projective pieces 31k2 therewith. Further, the projective pieces 31k1, each having an identical length, are provided on the diagonal line, and the projective pieces 31k2, each having the identical length are provided on the other diagonal line, thereby securely fixing the attachment part 1k on the printed substrate.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An attachment part comprising:
a base portion that has a through hole through which a lead of an optical component passes; and
a plurality of holding portions that are integrally provided in the base portion, that face each other, that hold a chassis of the optical component by elastic restoring forces of the plurality of holding portions, and that are elastically deformed based on whether or not the plurality of holding portions hold the chassis of the optical component.

2. The attachment part of claim 1, wherein the plurality of holding portions sandwich an outer peripheral portion around an axis of the chassis of the optical component.

3. The attachment part of claim 1, wherein the base portion has a definition surface that defines an angle of bending the lead passing though the through hole.

4. The attachment part of claim 3, wherein the definition surface of the base portion has a plurality of grooves that separate the leads bent from each other.

5. The attachment part of claim 1, wherein the base portion has a corner portion that facilitates bending of the lead passing through the through hole along the definition surface.

6. The attachment part of claim 1, wherein the base portion is compressively deformable by pressing such that the lead is sandwiched by the through hole.

7. The attachment part of claim 1, wherein the leads are capable of passing through the through hole, and a width of the through hole narrows to separate the leads.

8. The attachment part of claim 1, wherein the through hole has an oblong shape extending in such a direction to align the leads.

9. The attachment part of claim 1, further comprising a projection portion that is provided in the base portion, and that fits an attachment hole of a printed substrate to be engaged with the printed substrate.

10. The attachment part of claim 1, wherein the projection portion comprises a plurality of projective pieces that each has an end with a flange portion, and that move toward and away from each other.

11. The attachment part of claim 9, wherein the projection portion comprises a plurality of projection portions.

12. The attachment part of claim 10, wherein the plurality of projection pieces each has a different length.

13. The attachment part of claim 1, wherein the base portion has a base lock portion engaging and compressively deforming the base portion to maintain a state in which the lead is sandwiched by the through hole.

14. The attachment part of claim 1, wherein the base portion has a lever portion that is bendable with respect to the base portion and that assists in bending the lead.

15. The attachment part of claim 14, wherein the lever portion and the base portion have lever lock portions, respectively, that are engaged with each other to maintain a state in which the lever portion is bent with respect to the base portion.

16. The attachment part of claim 14, wherein the lever portion covers the lead when the lever portion is bent with respect to the base portion.

17. The attachment part of claim 14, wherein the lever portion and the base portion have guide portions that guide the lever portion to be bent.

18. The attachment part of claim 14, wherein the lever portion has a plurality of grooves that separate the leads bent, when the lever portion is bent with respect to the base portion.

19. The attachment part of claim 4, wherein the plurality of grooves has a shape guiding a distance between the leads to be constant from their secured ends to their free ends.

20. An electronic apparatus comprising:
an attachment part comprising:
a base portion that has a through hole through which a lead of an optical component passes; and
a plurality of holding portions that are integrally provided in the base portion, that face each other, that hold a chassis of the optical component by elastic restoring forces of the plurality of holding portions, and that are elastically deformed based on whether or not the plurality of holding portions hold the chassis of the optical component;
the optical component; and
a printed substrate.

* * * * *